United States Patent [19]

Terasawa et al.

[11] Patent Number: 5,621,497
[45] Date of Patent: Apr. 15, 1997

[54] PATTERN FORMING METHOD AND PROJECTION EXPOSURE TOOL THEREFOR

[75] Inventors: Tsuneo Terasawa, Ome; Shinji Okazaki, Urawa; Minoru Toriumi, Tokyo, all of Japan

[73] Assignee: Hitachi, Ltd., Tokyo, Japan

[21] Appl. No.: 415,937

[22] Filed: Apr. 3, 1995

[30] Foreign Application Priority Data

Apr. 6, 1994 [JP] Japan .................................. 6-068312

[51] Int. Cl.$^6$ .................................................. H01L 21/30
[52] U.S. Cl. ............................. 355/53; 355/67; 359/558
[58] Field of Search ................................ 355/53, 67, 71; 430/311; 359/559, 560, 563, 566, 558

[56] References Cited

U.S. PATENT DOCUMENTS

| 4,835,088 | 5/1989 | Gilson ................................ 430/311 |
| 5,305,054 | 4/1994 | Suzuki et al. ....................... 355/53 |

FOREIGN PATENT DOCUMENTS

| 0496891 | 8/1992 | European Pat. Off. . |
| 62-67514 | 3/1987 | Japan . |
| 62-50811 | 10/1987 | Japan . |
| 4-101148 | 4/1992 | Japan . |
| 4-267515 | 9/1992 | Japan . |

OTHER PUBLICATIONS

Applied Physics, vol. 37, No. 9 (1968), pp. 853–859.
p. 111, "Theory of Fourier Image–Formation" (Teruji Kose, issued by Kyoritsu Shuppan).

*Primary Examiner*—Joan H. Pendegrass
*Attorney, Agent, or Firm*—Antonelli, Terry, Stout & Kraus, LLP

[57] ABSTRACT

Disclosed is a pattern forming method including the steps of preparing second grating stripes disposed near a reticle having a mask pattern to be projected, modulating the mask pattern by emission of a light, and demodulating the modulated mask pattern by first grating stripes formed within a photosensitive film made of a material capable of reversibly inducing photochemical reaction, thereby forming the modulated image of the mask pattern within a resist film disposed under the photosensitive film. With this method, various kinds of fine patterns each being smaller than the resolution limit of a projection exposure tool used are formed.

25 Claims, 11 Drawing Sheets

PATTERN FORMING METHOD AND PROJECTION EXPOSURE TOOL THEREFOR

BACKGROUND OF THE INVENTION

The present invention relates to a pattern forming method and a projection exposure tool used for the method, and particularly to a pattern forming method capable of transferring various kinds of patterns much finer than the conventional ones on a specified substrate at a high accuracy, and a projection exposure tool suitable for the method.

As is well-known, lithography has been extensively used for formation of patterns of semiconductor integrated circuits or liquid crystal devices. This technique involves illuminating a reticle having a specified mask pattern, and projecting and forming an image of the mask pattern on a photosensitive film (resist film) formed on a specified substrate, thereby transferring the mask pattern on the photosensitive film. The specific examples of the above light include a ultraviolet-ray, excimer laser, electron beam and X-Ray. In this technique, a reduction type projection exposure tool has been commonly used, wherein a mask pattern formed on a reticle is transferred on a photosensitive film at a reduction rate of, for example ⅕.

As miniaturization of patterns of semiconductor integrated circuits or the like has been advanced, patterns finer than the conventional ones have been required to be formed at a resolution higher than the conventional one.

It is well-known that as the numerical aperture (NA) of a projection lens becomes larger or the wavelength of an exposure light becomes shorter, the resolution in formation of a pattern improves. However, to form a pattern of a large area on a photosensitive film, the projection lens must allow a large exposure field; consequently, the NA of the projection lens is difficult to be increased so much. The shortening of the wavelength of an exposure light, which is affected by a corresponding light source and materials of the projection lens and resist film, is nearing the critical value.

Under these circumstances where it is difficult to further increase NA and to further shorten the wavelength of an exposure light, several methods, which are capable of projecting a fine pattern smaller than the conventional resolution limit using the conventional projection exposure tool, have been proposed.

Examined Japanese Patent No. SHO 62-50811 discloses a phase shift method of generating an optical phase difference of an exposure light by a mask itself thereby significantly improving the resolution particularly with respect to a pattern having periodical apertures. Unexamined Japanese Patent No. SHO 62-67514 discloses a method, wherein even in transfer of a pattern which is substantially isolated, the resolution can be improved by further adding an auxiliary optical phase difference pattern. Unexamined Japanese Patent Nos. HEI 04-101148 and HEI 04-67515 disclose methods of improving the resolution by increasing the intensity of an illumination light only in a specified direction.

The resolution limit of a projected image is described in "Theory of Fourier Image-Formation" (Teruji Kose, issued by Kyoritsu Shuppan), p.111 and in Applied Physics, Vol. 37, No. 9 (1968), pp. 8523–859. As a technique of projecting a pattern having a high spatial frequency and being finer than the conventional resolution limit, these references propose a method of disposing grating patterns having specified frequencies on an object plane and an image plane respectively, and allowing the grating patterns to achieve functions of modulation and demodulation, respectively.

Specifically, a pattern having a spatial frequency $\nu$ expressed by a function of only x is disposed on a substance surface, and first grating stripes having a spatial frequency $\tau$ are disposed to be superimposed on the above pattern. As a result, stripes (moire rings) having the summed spatial frequency of $(\nu+\tau)$ and the differential spatial frequency $(\nu-\tau)$ are formed. By superimposing suitable first grating stripes on a mask pattern having a frequency $\nu$ larger than a coherent cut-off frequency ($\lambda$/NA) of a projection lens, the differential frequency $(\nu-\tau)$ can be set to be not more than the cut-off frequency. The moire rings pass through an optical system of the projection lens; accordingly, by superimposing second grating stripes having the spatial frequency $\tau$ on the moire rings on the image surface, the mask pattern can be projected.

In the methods disclosed in the above-described references, Examined Japanese Patent No. SHO 62-50811 and Unexamined Japanese Patent No. SHO 62-67514, transparent phase shifters capable of changing the phase of an exposure light by 180° are provided on alternate apertures in the opaque region of the mask, whereby the resolution is improved. In the methods disclosed in the above-described references, Unexamined Japanese Patent Nos. HEI 04-101148 and HEI 04-267515, the resolution superior to the conventional one can be obtained by adopting the so-called off-axis illumination for obliquely illuminating the mask.

In general, the resolution of a projection lens of a projection exposure tool is determined by both a wavelength $\lambda$ of an exposure light and a numerical aperture NA of the projection lens. The dimension R of the resolution limit is expressed by the following equation:

$$R=k_1 \lambda/NA$$

where $\lambda$ is a wavelength of an exposure light; and $k_1$ is a value depending on the exposure and development of the pattern (practically, about 0.6 to 0.8). The contrast of a projected image approaches 1 as the size of the pattern becomes larger; and it becomes 0 as the pattern size becomes smaller, that is, the spatial frequency becomes higher. In the meanwhile, a fine pattern having a spatial frequency higher than 2NA/$\lambda$, can not be projected. On the basis of these restrictions, the methods disclosed in the above-described references, Examined Japanese Patent No. SHO 62-50811 and Unexamined Japanese Patent No. SHO 62-67514 are intended to enhance the contrast of a projected image in a high spatial frequency region.

The methods disclosed in the above-described references, Unexamined Japanese Patent Nos. HEI 04-101148 and HEI 04-267515 are intended to slightly lower the contrast of a projected image in a low spatial frequency region and at the same time to enhance the contrast of a projected image in a high spatial frequency region. These methods are satisfactory to enhance the resolution as compared with the conventional method in the high spatial frequency region; however, they fail to project a fine pattern having a spatial frequency higher than 2NA/$\lambda$, because the limit of the spatial frequency of a transferable pattern is 2NA/$\lambda$ as described above.

On the other hand, in the method disclosed in the above-described reference, "Theory of Fourier Image-Formation" (Teruji Kose, issued by Kyoritsu Shuppan), p.111 or Applied Physics, Vol. 37, No. 9 (1968), pp. 853–859, the grating patterns having specified frequencies are respectively disposed on the object plane and the image plane, and allowed to achieve the functions of modulation and demodulation, thereby exhibiting a possibility of projecting a fine pattern having a spatial frequency higher than 2NA/λ. This method, however, has the following disadvantage: namely, the second grating stripes must be disposed on the surface of the wafer and be scanned for demodulating the information of the differential frequency transmitted through the projection lens and reproducing the image of the mask pattern on the wafer; but in most cases, the actual surface of the wafer has stepped portions of about 1 μm or more, and it does not allow the grating stripes for demodulation to be closely formed on the image plane having such irregularities and to be scanned.

As is apparent from the above description, as the dimension of a pattern to be formed is finer, the spatial frequency thereof becomes higher and thereby the contrast is significantly reduced. As a result, in the case of using i-line or excimer laser as an exposure light, the resolution limit becomes the order of the wavelength thereof, that is, it is difficult to form a fine pattern having a resolution limit finer than about 0.35 μm or 0.25 μm. Even in the above-described method of providing the optical phase difference of an exposure light to the mask itself, the practical value of $k_1$ is about 0.35, and accordingly, it is difficult to form a fine pattern having a resolution finer than about ½ of the wavelength.

SUMMARY OF THE INVENTION

An object of the present invention is to solve the above-described problems of the prior art pattern forming methods, and to provide a pattern forming method capable of forming a fine pattern being finer than the conventional resolution limit of a projection lens and having a spatial frequency higher than a spatial frequency 2NA/λ of the projection lens, and a projection exposure tool used in the method.

Another object of the present invention is to provide a pattern forming method capable of projecting a fine pattern being finer than the conventional resolution limit of a projection lens on the surface of a wafer with irregularities using the functions of modulation and demodulation, and a projection exposure tool used in the method.

To achieve the above object, according to the present invention, there is provided a pattern forming method wherein, on a plane where a Fourier transform pattern obtained from a mask pattern, the position of the Fourier transform pattern is shifted by a specified amount in the direction perpendicular to the optical axis for modulating a spatial frequency; interference stripes (first pattern) are formed within a photosensitive film which is capable of reversibly inducing photochemical reaction for a short time and which is formed on the surface of a wafer as a substrate to be exposed; and the interference stripes are moved in both the directions within the photosensitive film by emitting a light having a specified frequency, thereby demodulating the interference pattern.

The modulation of the above spatial frequency is performed, for example, by provision of a grating stripe pattern (second pattern) having a specified spatial frequency on a mask pattern or the conjugated surface thereof. The interference stripes as the first pattern are formed by emitting a light on a wafer substrate at least in two directions.

The second pattern acts as a means for modulating the spatial frequency, and it interferes with the mask pattern, thus forming a pattern having different spatial frequencies, that is, moire rings. A diffractive light forming the moire rings passes through the projection lens, and thereby the mask pattern information is transmitted on a photosensitive film formed on the surface of the wafer. The photosensitive film is made of a material which exhibits photosensitivity only during the light is emitted substantially for formation of the interference stripes, and at this time the transmittance or refractive index is changed; and after completion of light emission, the transmittance or refractive index is returned to the original one. By emitting a laser light to the photosensitive film at very small grazing angles in two opposed directions, interference stripes are formed within the photosensitive film. These interference stripes act as the first pattern with respect to an exposure light for projecting a pattern. As a result, by scanning the interference stripes through changing the phase of the light used for formation of the interference stripes, the interference stripes as the first pattern are moved within the photosensitive film.

In the photosensitive film, a complex index of refraction corresponding to an exposure light (used for exposure of the reticle) changes only during an interference light is emitted; and after completion of the emission of the interference light, it is returned to the original one. The time response in such a reversible reaction is as very rapid as several ten nanoseconds or less. For example, when the wavelength of an exposure light is 365 nm and the wavelength of an interference light is 265 nm, there can be used a photosensitive film made of a material obtained by dissolving in solvent a composition of naphthalene and novolak resin at a weight ratio of 1:5. The photosensitive film made of such a material has a response time being as very rapid as one nanosecond (1 ns) or less, and it is reversibly reacts with the light. In addition, since the mask pattern is transferred on the photosensitive film, it is desirable that the film thickness of the photosensitive film is as thin as possible, for example, 0.2 μm or less.

The first pattern must be moved by at least one stripe for each exposure for projection of the mask pattern; and, since the photosensitive film has the above property, the scanning operation can be made without any problem.

To simplify the description for easy understanding, the coordinate system of the optical system will be described.

Letting (m) be the absolute value of a magnification of a projection lens and NA be the numerical aperture of the projection lens on the wafer side, the numerical aperture of the projection lens on the mask side is expressed by m×NA. In the usual projection exposure, the value of (m) is commonly taken as 0.2.

In the case where the non-dimensional unit of the length on the mask side numelized by λ/(m.NA) is taken and the non-dimensional unit of the length on the wafer side numelized by λ/NA is taken, the magnification of the lens is made not to be in consideration, and the image-forming optical system can be apparently regarded as one with a magnification of 1. Thus, the spatial frequency will be described below using the non-dimensional coordinates.

In the present invention, as the second pattern (grating stripes) which is the means for modulating the mask pattern, a transmission type phase grating obtained by forming a large number of linear projections and recesses on the surface of a transparent substrate is used. The same effect can be obtained using off-axis illumination of the mask pattern. The second pattern (grating stripes) is not necessarily constituted of the transmission type phase grating, and may be constituted of a diffraction grating obtained by forming a large number of shadow lines on the surface of the transparent substrate. Letting $\tau$ be a spatial frequency of the grating stripes as the second pattern, stripes having the spatial frequency ($v-\tau$) can be obtained as described above, and which passes through the projection lens.

The first pattern having a spatial frequency $\tau$ is formed within the photosensitive film applied on the surface of the wafer by the above laser interference. Thus, there can be obtained stripes having the summed spatial frequency $\{(v-\tau)+\tau\}$ and the differential spatial frequency ($v-2\tau$) by the stripes having the spatial frequency ($v-\tau$) passing through the projection lens and the first pattern. Of these stripes, only the stripes having the summed spatial frequency $v$ is fetched, thus transferring the mask pattern.

The above function will be described bellow in detail. When a mask pattern is a linear periodical pattern 40 extending in the y direction shown in FIG. 4, the amplitude transmittance is expressed by the following equation (1), which is the function of only x.

$$M(x)=\Sigma a_n \exp(2\pi n v x i) \tag{1}$$

The amplitude transmittance of the grating stripes as the second pattern is expressed by the following equation (2).

$$O(x)=\Sigma b_n \exp(2\pi n \tau x i) \tag{2}$$

Letting m($\zeta$) and O($\zeta$) be Fourier transform patterns of the M(x) and O(x), a spectrum o''($\zeta$) of the mask pattern superimposed with the grating stripes as the second pattern is obtained by the convolution of the m($\zeta$) and O($\zeta$), and is expressed by the following equation (3).

$$o'(\zeta)=\int O(\zeta')m(\zeta-\zeta')d\zeta'=\Sigma a_n o(\zeta-nv) \tag{3}$$

The component contributing to the image-formation is only the spectrum components passing inside the pupil 42 of the projection lens, and the spectrum components at outside the pupil 42 of the projection lens do not contribute the image-formation. Accordingly, of the above spectrum components, the high-order components may be omitted and only the low-order components may be examined. Assuming that the dimension of the mask pattern shown in FIG. 4 is approximated to the resolution limit and the grating stripes as the second pattern are made of a phase grating 41 shown in FIG. 5, the M(x) and O(x) are shown in the following equation (4) indicating the mask pattern and the following equation (5) indicating the second pattern (n=−1 and n =1), respectively.

$$M(x)=a_{-1} \exp(-2\pi v x i)+a_0+a_1 \exp(2\pi v x i) \tag{4}$$

$$O(x)=b_{-1} \exp(-2\pi \tau x i)+b_1 \exp(2\pi \tau x i) \tag{5}$$

At this time, the Fourier transform pattern m($\zeta$) and O($\zeta$) formed near the pupil 42 of the projection lens are the spectra 43, 44, 45 shown in FIG. 6, and spectra 46, 47 shown in FIG. 7. Accordingly, the spectrum components passing inside the pupil 42 are 48, 49 shown in FIG. 8.

The spectra 44' corresponds to the spectra 43 shifted to the position 46, and the spectra 44" corresponds to the spectra 43 shifted to the position 47.

The spectrum o'($\zeta$) of the mask pattern superimposed with the grating stripes as the second pattern is expressed by the following equation (6).

$$o'(\zeta)=a_{-1}b_1\delta\{\zeta+(v-\tau)\}+a_1b_{-1}\delta\{\zeta-(v-\tau)\} \tag{6}$$

In the equation (6), letting $a_{-1}=a_1$, $b_{-1}=b_1$, $c=a_1 b_1$, the amplitude distribution u(x) of a light projected on the wafer is expressed by the following equation (7) by Fourier inverse Fourier transform.

$$u(x)=2c \cos\{2\pi(v-\tau)\}x \tag{7}$$

In addition, to obtain the spectrum for modulation shown in FIG. 7, for example, a light source 51 may be formed at an off-axis position inside a shadow portion 50, as shown in FIG. 9, for illuminating the reticle 3 in the oblique direction as shown in FIG. 10. This eliminates the necessity of provision of the second pattern.

As described above, a photoresist film capable of reversibly inducing chemical reaction for a short time is formed on the surface of a substrate on which a mask pattern should be transferred, and grating stripes as the first pattern are formed within the photosensitive film. Letting $\tau$ be a spatial frequency of the grating stripes as the first pattern, the amplitude distribution of a light finally reaching the surface of the resist film is expressed by the following equation (8).

$$u(x)=2c \cos\{2\pi(v-\tau)\}x \cos(2\pi\tau)x=c \cos(2\pi v)x+c \cos\{2\pi(v-2\tau)\}x \tag{8}$$

In the equation (8), the second term on the right side is averaged by scanning of the grating stripes while keeping the period and it disappears, and thus only the pattern information shown as the first term remains, thus finally obtaining the projected image of the spatial frequency v. The equation (8) represents the projected image of the pattern obtained by the equation (4). The feature of the present invention lies in that the second term is eliminated by the emission of a light and the elimination is performed within the photosensitive film capable of reversibly inducing photochemical reaction.

The scanning of the grating stripes as the first pattern can be easily performed by emitting a laser beam in two opposed directions, and changing the phases of both the laser beams at the same time thereby moving the interference stripes. The laser beam is phase-controlled so as to be emitted toward the whole region on which the mask pattern should be projected, and so as to scan several stripes for each exposure. When a diffraction grating as the grating stripes constituting the fist pattern is formed near the surface of the substrate, the scanning of the grating stripes as the first pattern is performed by changing the position of the diffraction grating relative to the substrate. Even in this case, the moving rate of the diffraction grating relative to the substrate is set to scan several stripes for each exposure.

Even when the diffraction grating is used as the first pattern, a mask pattern can be formed on a resist film, so long as the surface of the substrate is flattened. However, for example, the surface of the substrate has usually stepped portions or irregularities, as a silicon substrate used for fabrication of a semiconductor device, so that it is more preferable to form the first pattern within the photosensitive film.

DETAILED DESCRIPTION OF THE PREFERRED EMBODIMENTS

EXAMPLE 1

Figure 1:
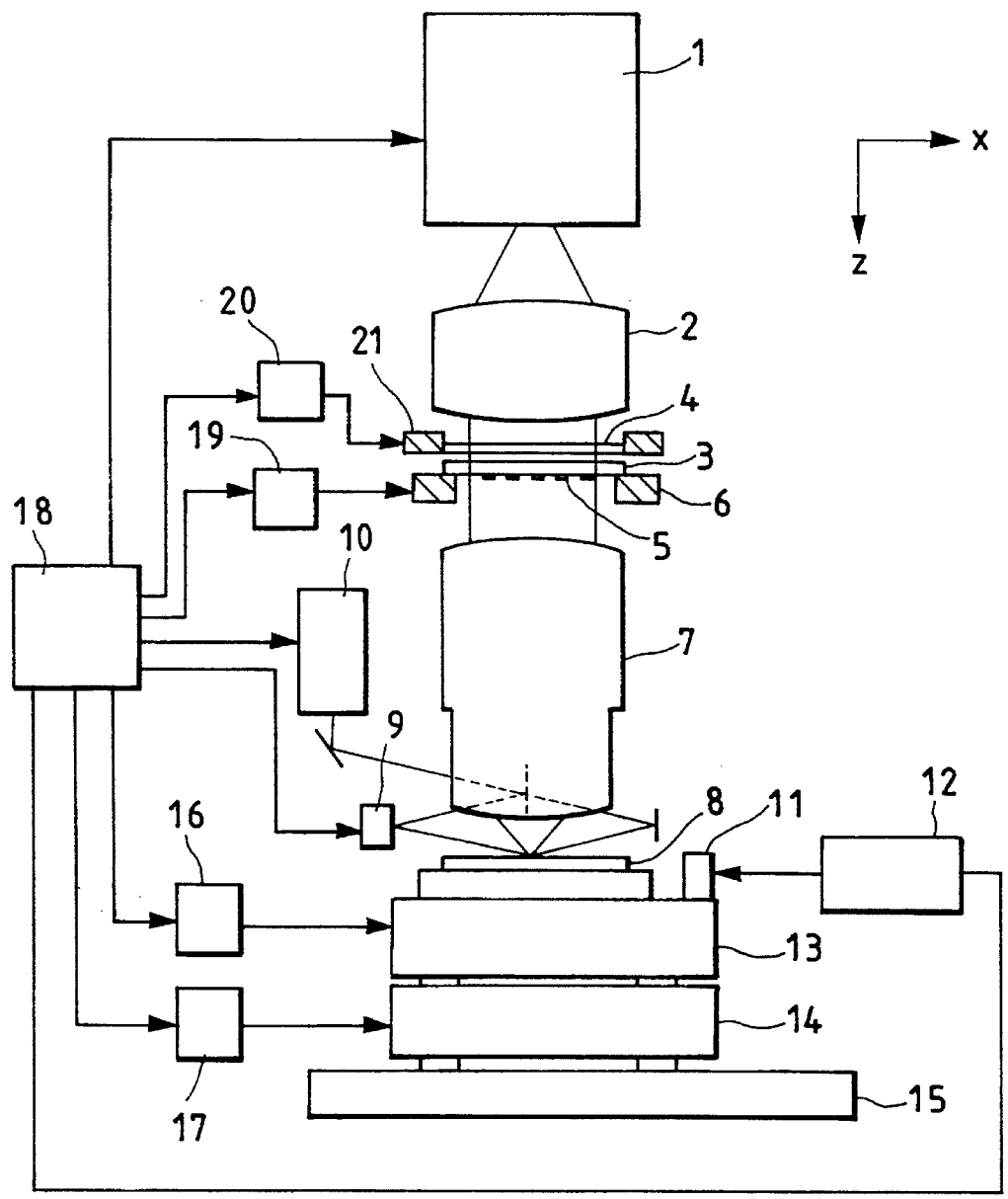
FIG. 1 is a view showing one example of the construction of a projection exposure tool according to the present invention.

FIG. 1 is a typical view showing one example of the construction of a projection exposure tool used for carrying out a pattern forming method of the present invention.

In FIG. 1, an exposure light (wavelength=365 nm) emitted from a light source 1 was converted into a substantially straight beam through a condenser lens 2 for illuminating a reticle 3. A pattern 5 formed on the reticle 3 was projected through a projection lens 7 having a magnification of 1/5 to a wafer 8 on which the pattern 5 should be transferred.

The reticle 3 was placed on a stage 6 controlled by a reticle position control means 19, and it was accurately positioned such that the center of the reticle 3 was set to correspond to the optical axis of the projection lens 7. The wafer 8 was placed on a Z stage 13 movable in the direction of the optical axis of the projection lens 7 or the Z direction, and on an XY stage 14 movable in the XY directions. The Z stage 13 and the XY stage 14 were driven by drive means 16, 17 on the basis of a control command from a main control system 18, respectively, to be thus moved in a specified exposure position relative to a base 15 of the projection exposure tool. The position of the wafer 8 was accurately monitored by a laser interferometer 12 by way of a mirror 11 fixed on the Z stage 13. The surface position of the wafer 8 was measured by a common focus position measuring means of the projection exposure tool, and on the basis of the measured result, the Z stage 13 was driven such that the surface of the wafer 8 was usually set to correspond to the image plane of the projection lens 7.

Figure 2:
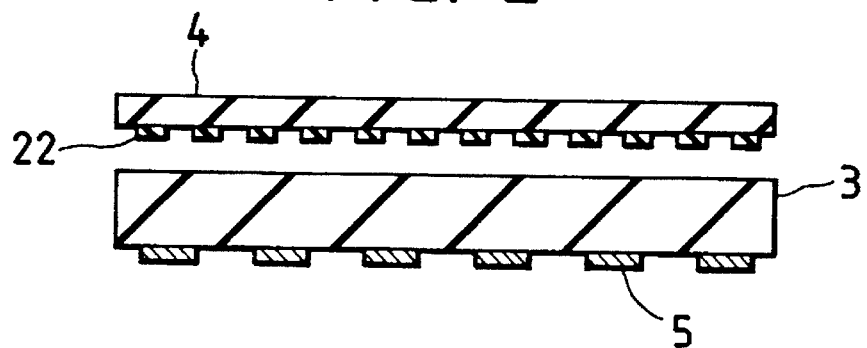
FIG. 2 is a sectional view showing a phase grating as a second pattern for modulating an exposure light and a reticle.

In this example, a transmission type grating optical element 4 acting as grating stripes constituting a second pattern, was disposed over and in close proximity to the reticle 3; however, it may be disposed at a position conjugated to that of the reticle 4. In this example, as the optical grating 4, a phase grating 4 having pitches of 2 μm was used. The phase grating 4 was formed by provision of a number of linear irregularities 22 on the surface of a transparent substrate 4', as shown in FIG. 2. The phases of illuminating lights are reversed when they pass through projections and recesses of the irregularities 22.

Figure 7:
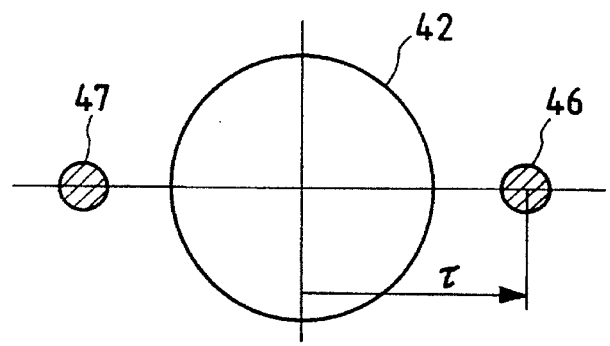
FIG. 7 is a view showing one example of a Fourier transform pattern of a phase grating.

Letting τ be a spatial frequency of the irregularities 22 of the phase grating 4, the spectrum thereof has a distribution shown in FIG. 7 along the incident pupil of the projection lens 7. The phase grating 4 was mounted on a stage 21 in such a manner as to be movable in the specified direction within the plane by a drive means 20.

Figure 6:
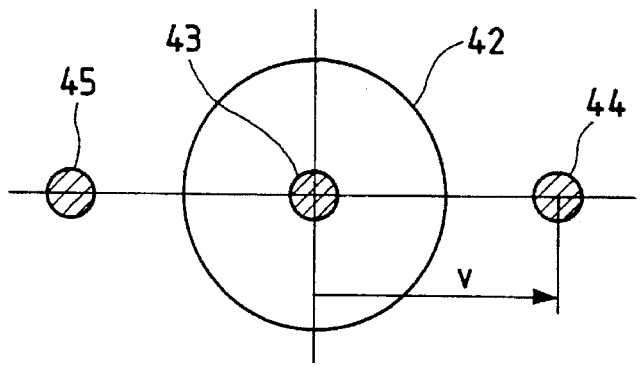
FIG. 6 is a view showing one example of a Fourier transform pattern from a reticle pattern.
Figure 8:
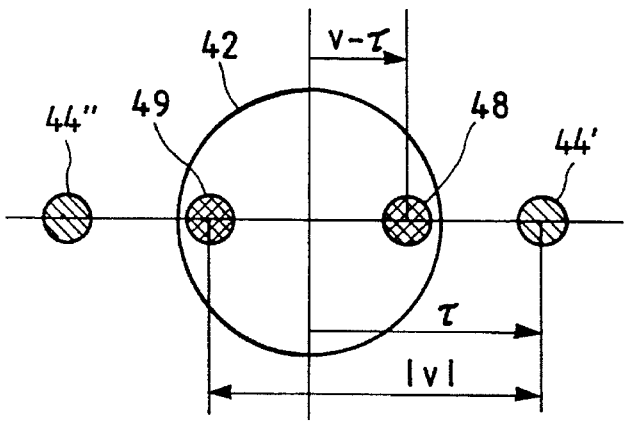
FIG. 8 is a view showing a Fourier transform pattern from a pattern obtained by superimposing a phase grating on a reticle pattern.
Figure 9:
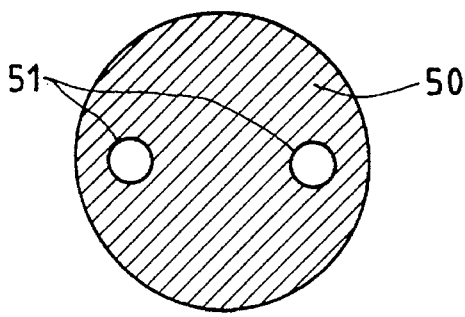
FIG. 9 is a view showing the shape of a light source for off-axis illumination for a reticle pattern.
Figure 10:
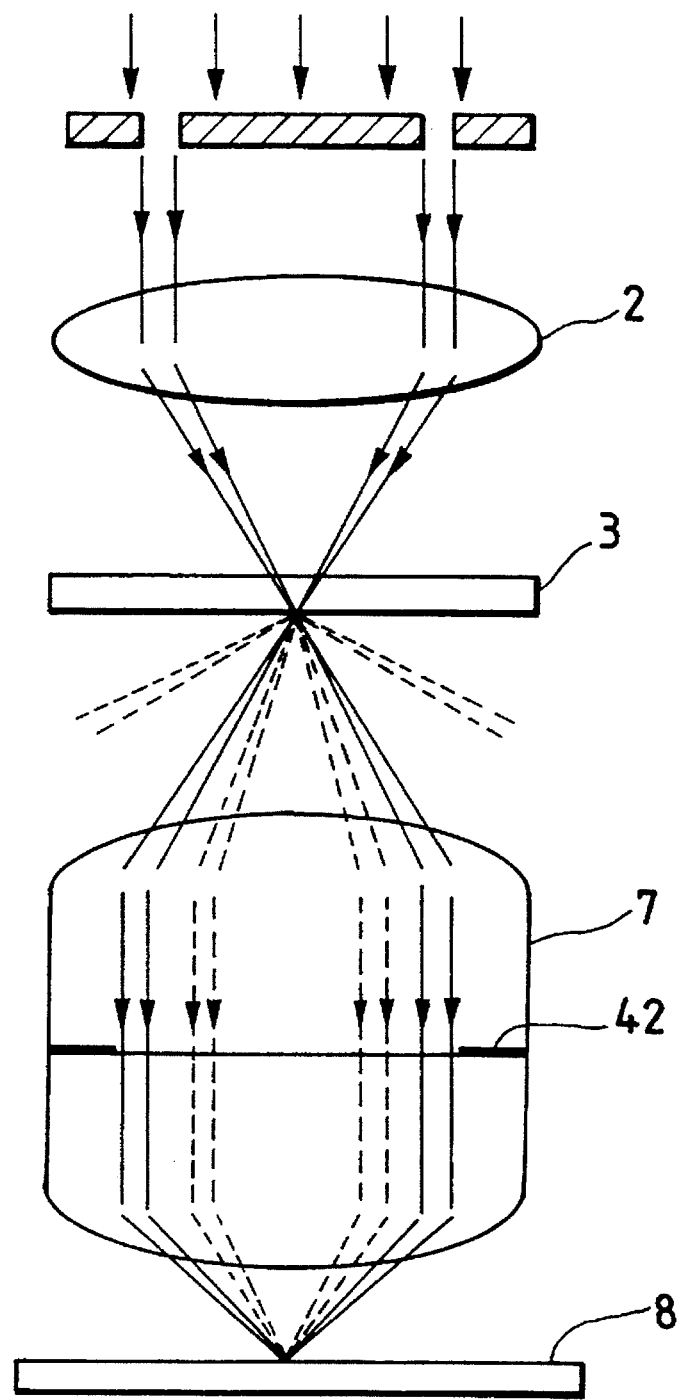
FIG. 10 is a view for illustrating a projection optical system used for off-axis illumination for a reticle pattern.

As shown in FIG. 2, the mask pattern 5 being the same as the conventional one was formed on the reticle 3. In the case where a spatial frequency ν of the mask pattern 5 is lager than a cut-off frequency of the projection lens, the spectrum of the mask pattern 5 has a distribution shown in FIG. 6. Accordingly, by performing projection exposure in such a state that the grating stripes as the second pattern (in this case, phase grating 4) were superimposed on the reticle 3 as shown in FIG. 1, a Fourier spectrum of a composite pattern shown in FIG. 8 was obtained.

Figure 3:
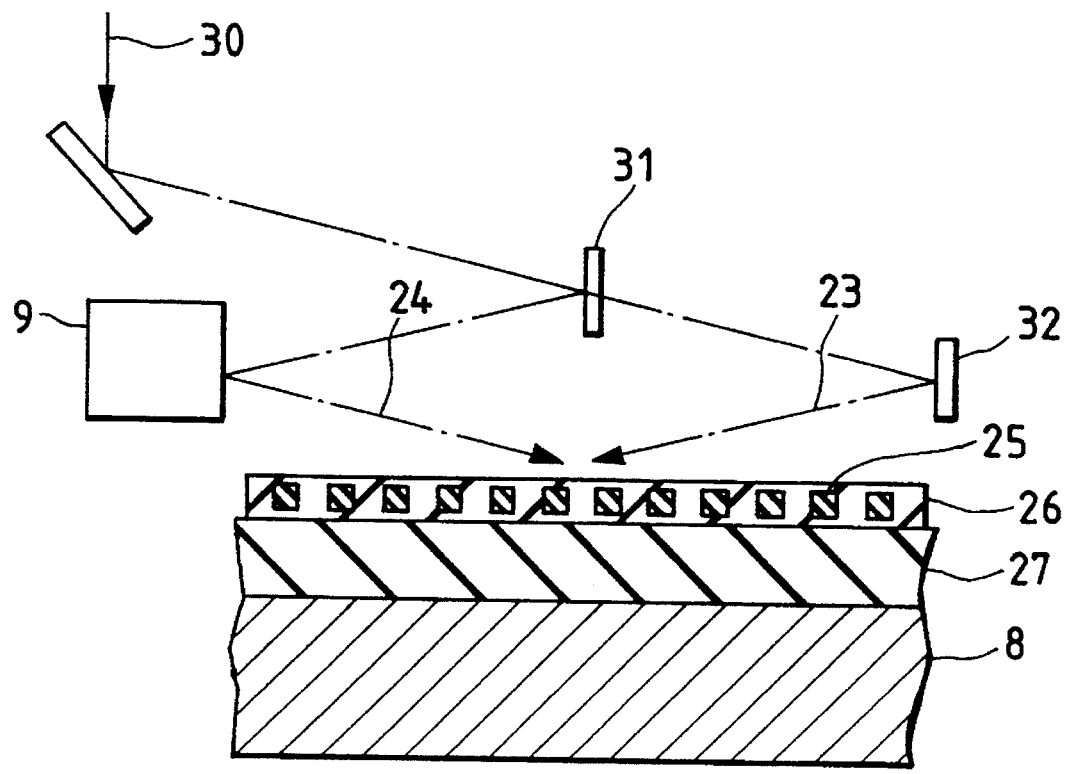
FIG. 3 is a view showing a method of forming grating stripes as a first pattern for demodulating a modulated light.
Figure 4:
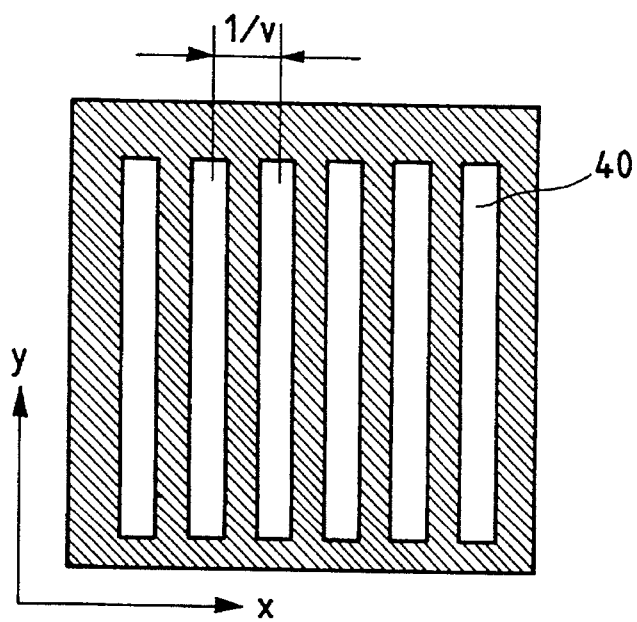
FIG. 4 is a plan view showing one example of a one-dimensional reticle pattern.
Figure 5:
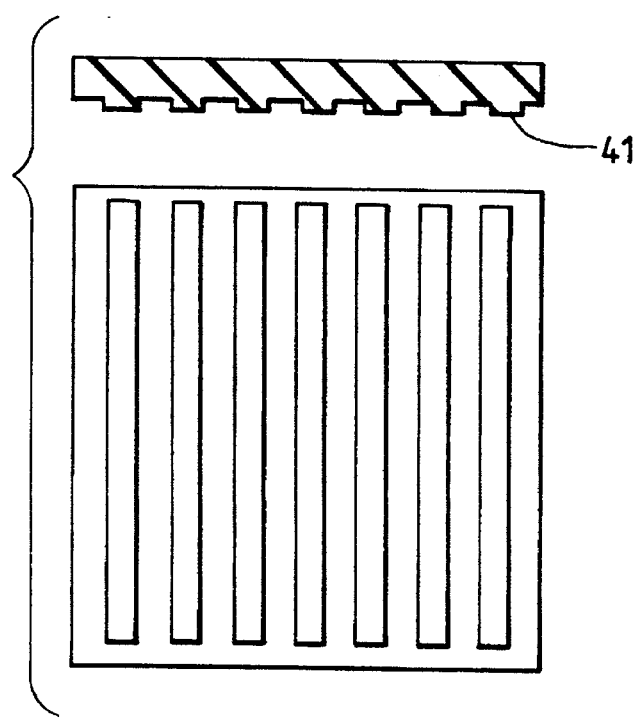
FIG. 5 is a view showing one example of a plan structure and sectional structure of a phase grating.

To form grating stripes (interference stripes) on a photosensitive film 26 provided on the surface of the wafer 8, a beam 30 with a fourth harmonic wave (wavelength: 265 nm) of an YAG laser as a laser source 10 was divided by a beam splitter 31 once as shown in FIG. 3 for obliquely emitting the photosensitive film 26 through a reflection control unit 9 and a mirror 32.

As shown in FIG. 3, grating stripes 25 having pitches of 0.4 μm were formed within the photosensitive film 25 by laser beams 23, 24 emitted from the mirror 32 and the reflection control unit 9. The pitch of 0.4 μm is a value obtained by multiplying the pitch (2 μm) of the grating stripes (phase grating) as the second pattern by the magnification (1/5) of the projection lens 7.

As shown in FIG. 3, a photoresist film 27 was formed on the wafer 8 by the known coating method, on which a photosensitive film 26 (thickness: about 0.2 μm) made of a material capable of reversibly inducing photochemical reaction for a short time was formed by the known coating method. In this example, the material of the photosensitive film 26 was obtained by dissolving in solvent a composition of naphthalene and a novolak resin at a weight ratio of 1:5. The photosensitive film 26 has a response time in the order of pico second relative to a light of a wavelength of 265 nm, and it reversibly reacts with the light. Accordingly, in the photosensitive film 26, the grating stripes 25 are recorded and the complex index of refraction is changed with respect to an exposure light (365 nm) against the reticle 3 only during the laser beams 23, 24 are emitted thereto. As a result, the grating stripes 25 as the first pattern having the spatial frequency τ were thus formed, and which were used as a demodulating means.

The grating stripes 25 as the first pattern were moved within the photosensitive film 26 by changing the phase of the laser beam 24 using the reflection control unit 9. A fine pattern (line width: 0.2 μm) smaller than the conventional resolution limit was thus formed on the photosensitive film 27 by pattern exposure through scanning of the grating stripes as the second and first patterns at a scanning rate of 5:1 corresponding to the magnification (⅕) of the projection lens 7.

Similar effect also can be obtain by illuminating a first and second grating patterns at predetermined positions, respectively, and subsequent illuminating of those first patterns often shifting them by half pitch.

Since the grating stripes 25 as the first pattern were formed by the interference of the two light beams, they were not affected by stepped portions formed in a common semiconductor process and were prevented from being deteriorated. Thus, the grating stripes having excellent shapes was obtained.

The material of the photosensitive film 26 can be obtained by dissolving in solvent a composition of N,N'-di-(P-methylphenyl)-γ,γ'-dipyridium-dimethylaniline complex and a novolak resin at a weight ratio of 1:5; dissolving in solvent a composition of fluorene and a novolak resin at a weight ratio of 1:5; or dissolving in solvent a composition of biphenyl and a novolak resin at a weight ratio of 1:10. Alternatively, the materials of the photosensitive film 26 and the photoresist film 27 may be previously mixed and applied on the wafer 8. In either case, a fine resist pattern smaller than the conventional resolution limit was obtained by the common development.

The beam splitter 31, reflection control unit 9, mirror 32 and the like were of course disposed so as not to shield the exposure light path for projecting the mask pattern 5 on the wafer 8.

EXAMPLE 2

Figure 11:
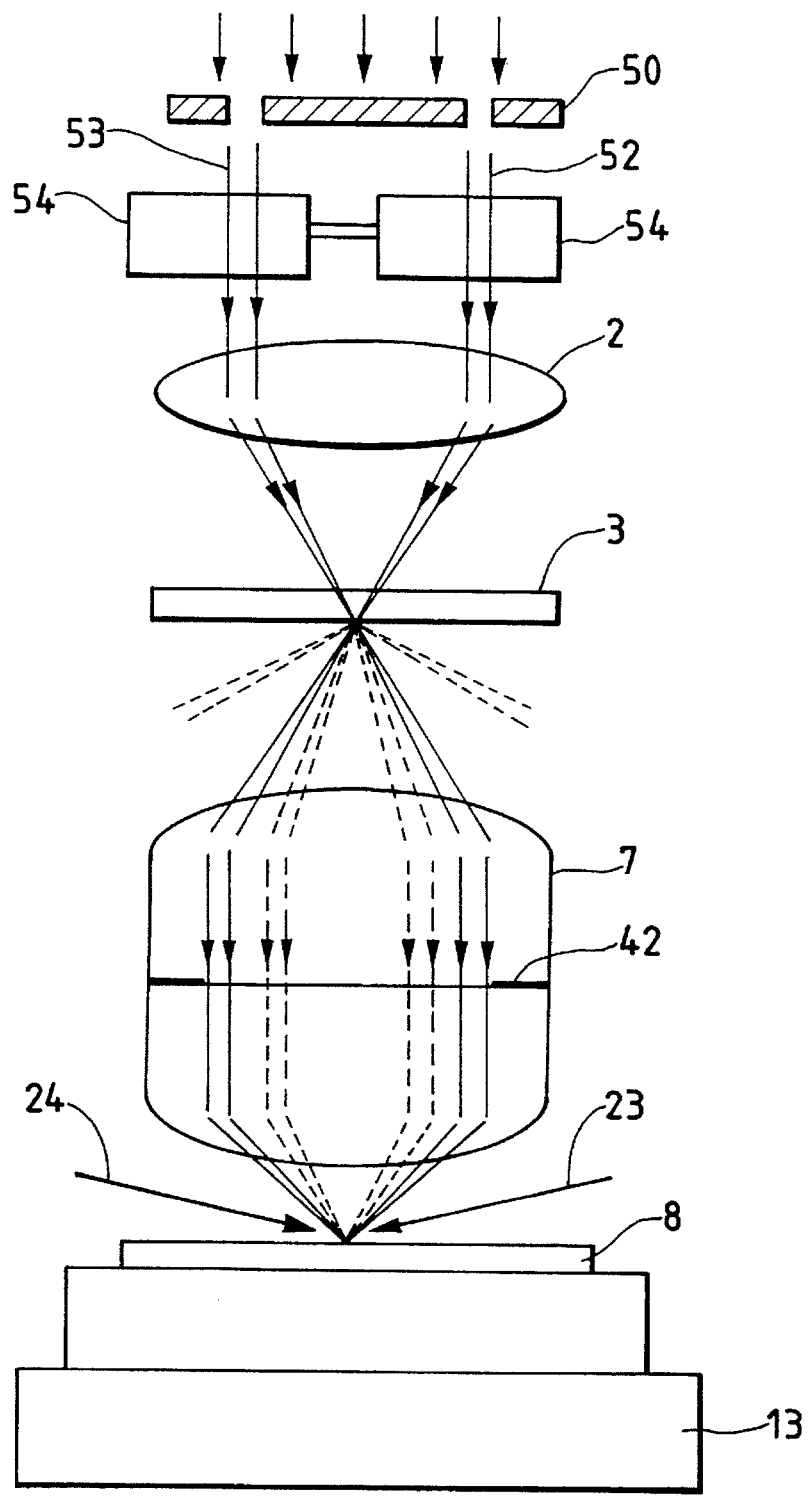
FIG. 11 is a view for illustrating a projection optical system using off-axis illumination as a means of modulating a reticle pattern.

In this example, as shown in FIG. 11, the mask pattern is modulated by off-axis illumination for the reticle 3 in place of using the phase grating 4 as the second pattern in Example 1. This example is the same as Example 1, except that the phase grating 4 is not used as described above; accordingly, only an optical system necessary for the description is shown in FIG. 11.

Letting θ be the incident angle of a light for illuminating the reticle 3, the off-axis illumination for the reticle 3 at the incident angle θ using a light of a wavelength λ is equivalent to the case where the grating with pitches of λ/sinθ is disposed as the second pattern as shown in Example 1. Accordingly, the same effect as in Example 1 was obtained by off-axis illumination for the reticle 3 using an exposure light, in place of using the phase grating 4.

When the incident angle θ is made larger than the angle corresponding to the NA of the projection lens on the reticle side, the grating (second pattern) having pitches of λ/sin θ is made larger than the cut-off frequency of the projection lens 7.

The phases of illuminating lights 52, 53 for obliquely illuminating the reticle 3 through aperture portion of a plane 50 defining the shape of the light source were relatively changed by phase converting means 54, 55. Thus, the same effect as in the case of scanning the phase grating 4 in Example 1 was obtained.

On the other hand, like Example 1, a photoresist film 27 and a photosensitive film 26 were stacked on the surface of the wafer 8, and laser beams 23, 24 were obliquely emitted on the photosensitive film 26 in two oblique directions, to form grating stripes 25 constituting the first pattern as shown in FIG. 3. By scanning the grating stripes 25 as the first pattern in the same manner as in Example 1, a fine pattern (line width: 0.2 μm) smaller than the conventional resolution limit was formed on the photoresist film 27.

In this example, the grating stripes as the second pattern are not required to be disposed near the reticle 3, and further the grating stripes as the second pattern are not required to be scanned; consequently, the structure of the tool is simplified as compared with Example 1, and nevertheless the same effect as in Example 1 can be obtained.

EXAMPLE 3

In this example, the present invention is applied to a scanning type projection exposure tool. Grating stripes as the first and second patterns are formed in such a manner as to be fixed relative to a projection optical system, and a reticle 3 and a wafer 8 are scanned. This example will be described with reference to FIG. 12.

The reticle 3 was illuminated by a light emitted from an illuminating light source 101, and a mask pattern formed on the reticle 3 was projected on the wafer 8 by way of an image-forming optical system including plane mirrors 60, 63, a concave mirror 61 and a convex mirror 62. In this case, the region of the reticle 3 illuminated by the exposure light is limited; however, the wide region of the mask pattern formed on the reticle 3 can be transferred by scanning the reticle 3 and the wafer 8 in synchronization with each other.

The grating stripes as the first and second patterns were disposed in the same manner as in Example 1. Specifically, a phase grating 4 was used as the grating stripes as the second pattern, and it was disposed in close proximity to the reticle 3. As the grating stripes as the first pattern, there were used grating stripes formed by a laser beam reflected by reflecting portions 9, 32, as shown in FIG. 3. The first and second stripes were not scanned, but a reticle stage 103 mounting the reticle 3 and a wafer stage 102 mounting the wafer 8 were scanned in synchronization with each other. With this arrangement, like Examples 1 and 2, a fine pattern (line width: 0.2 μm) smaller than the conventional resolution was formed on a photoresist film formed on the surface of the wafer 8.

Figure 12:
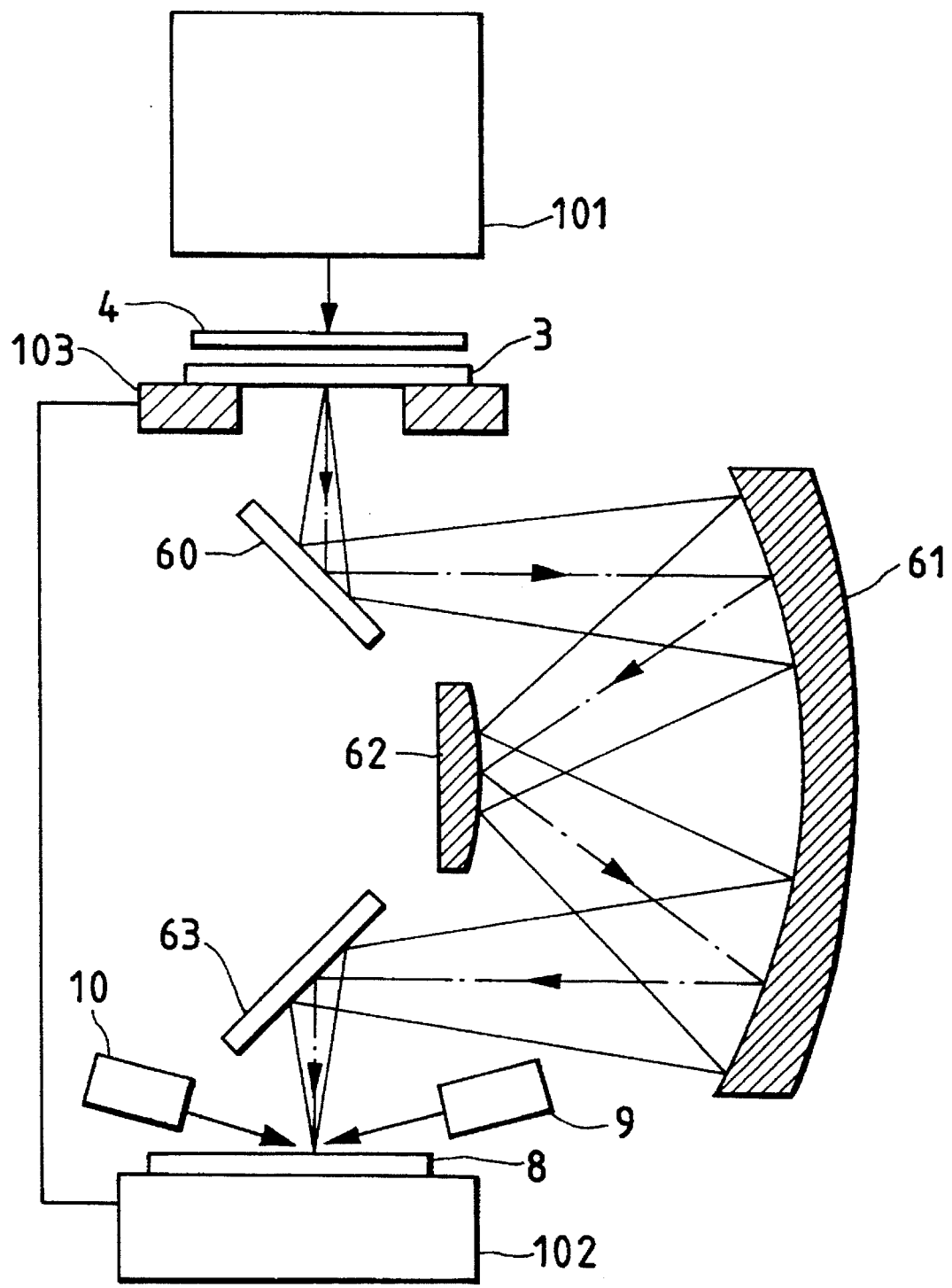
FIG. 12 is a view showing an example in which a reticle is scanned in synchronization with a wafer.

The tool shown in FIG. 12 is of an equal size projection type, and accordingly, the reticle 3 and the wafer 8 are moved at the same velocity. For the reduction type projection exposure tool, the reticle 3 and the wafer 8 may be respectively moved at the velocity ratio corresponding to the reduction ratio of a projection lens of the tool.

This example is advantageous in that, only respective grating stripe patterns are formed on the reticle and on the photosensitive film formed on the wafer in the conventional projection exposure tool, and a means for scanning the grating stripe patterns relative to an optical system is not required to be additionally provided.

In this example, for modulation of the mask pattern, the grating stripes as the second pattern were superimposed on the reticle 3 in the scanning type projection exposure tool; however, the same effect was obtained by a method wherein the reticle 3 was obliquely illuminated in place of using the grating stripes as the second pattern. Moreover, the same effect was obtained by a method wherein, as the grating stripes as the second pattern used for the modulating means, grating stripes similar to those as the first pattern were disposed near the reticle 3.

In the case where the wafer 8 has a very flat surface, or in the case where the obtained pattern does not require high accuracy so much, there may be adopted a method of disposing a transmission type grating on the upper surface of the wafer 8 in place of the demodulating means used in each of Examples 1 to 3, and performing demodulation by mechanically scanning the above grating.

In this case, not only the lubricating effect but also the effect of improving the resolution due to oil immersion can be obtained by interposing a fluid (gas or liquid) having a refractive index larger than 1 between the wafer 8 and the transmission type grating.

EXAMPLE 4

In this example, as the grating stripes as the second pattern to be disposed in close proximity to the reticle 3, grating stripes formed by interference of two light beams of laser were used.

Figure 13:
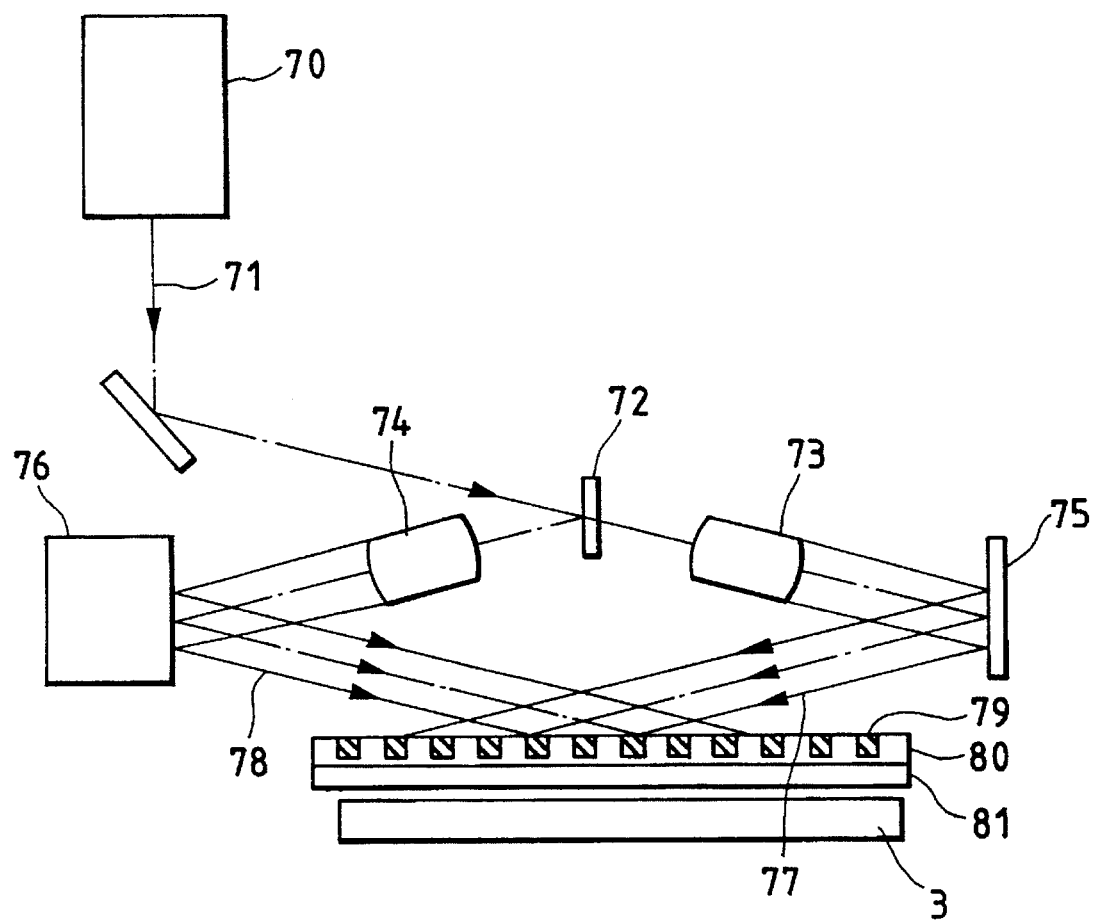
FIG. 13 is a view showing an example in which grating strips as the second pattern are formed near a reticle surface by interference of a light.

As shown in FIG. 13, a transparent substrate 81 was disposed in close proximity to the reticle 3, and a photosensitive film 80 (thickness: about 0.2 µm) made of a material capable of reversibly inducing photochemical reaction for a short time was formed on the surface of the transparent substrate 81. This example was the same as in Example 1, except that the transparent substrate 81 was disposed in proximity to the reticle 3. Accordingly, FIG. 13 shows only a portion where the transparent substrate 81 provided on its surface with the photosensitive film 80 is disposed in close proximity to the reticle 3 for generating grating stripes as the second pattern.

As shown in FIG. 13, a laser light 71 emitted from a light source 70 was divided through a beam splitter 72. The divided lights were formed into straight beams each having wide width by means of width extension optical systems 73, 74, and were reflected by a mirror 75 and a reflection control unit 76, to be formed in two light beams 77, 78. The light beams 77, 78 were emitted in the photosensitive film 80. As a result, grating stripes 79 as the second pattern were formed within the photosensitive film 80. In this case, the phase of the beam 78 was controlled by the reflection control unit 76, and the grating stripes 79 as the second pattern were scanned by means of the beam 78.

The scanning rate was synchronized with that of the grating stripes 25 as the first pattern on the basis of the magnification (⅕) of a projection lens. Specifically, the grating stripes 79 as the second pattern were scanned at a scanning rate being five times that of the grating stripes 25 as the first pattern on the wafer 8. Thus, the same effect as in Example 1 was obtained, without mechanical movement of the grating stripes 70 as the second pattern. As a result, a fine pattern (line width: 0.2 µm) smaller than the conventional resolution limit was formed on a photoresist film (not shown).

As a material of the photosensitive film 80 capable of reversibly inducing photochemical reaction for a short time, there may be used the material of the photosensitive film 26 (FIG. 3) used in Example 1 for forming the grating strips as the first pattern.

The reticle 3 and the granting stripes 79 as the second pattern shown in FIG. 13 may be applied as they are, for example, to the scanning type exposure optical system shown in FIG. 12. In this case, the grating stripes 79 are not required to be scanned.

EXAMPLE 5

Figure 14:
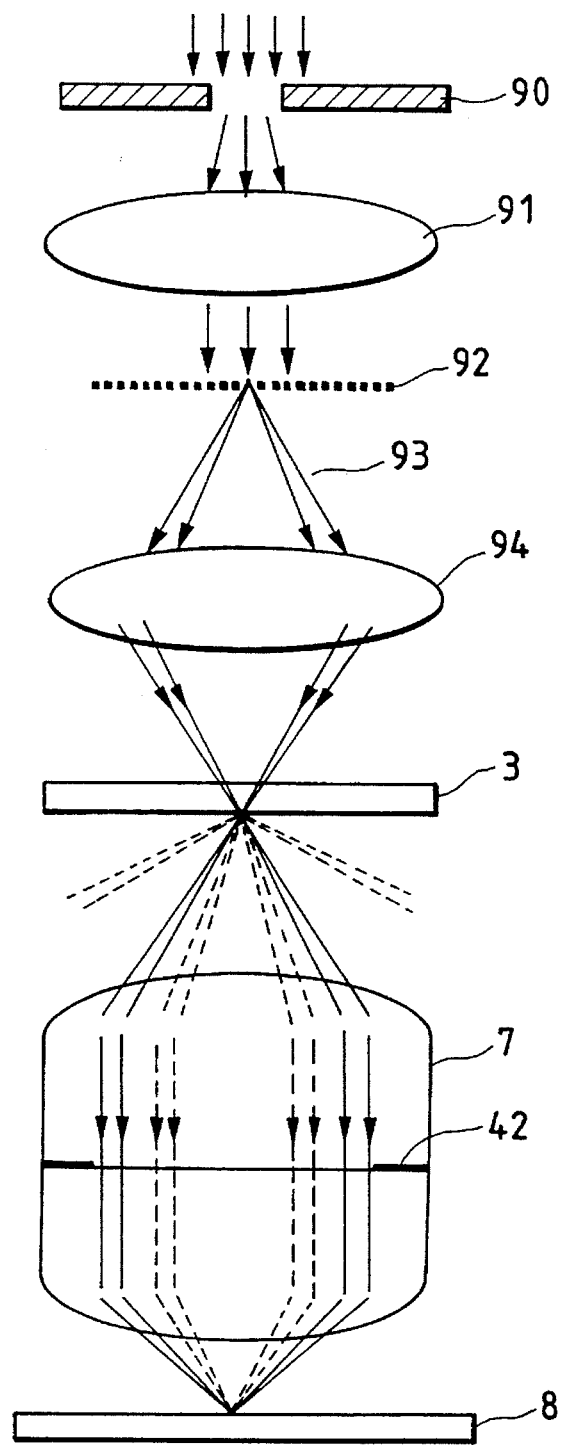
FIG. 14 is a view showing an example in which grating stripes as the second pattern are disposed in a conjugated position to a reticle.

In this example, as shown in FIG. 14, grating stripes 92 as the second pattern were provided at a position conjugated to a reticle 3. An optical system disposed between the reticle 3 to a wafer 8, and grating stripes as the first pattern were the same as those shown in FIG. 1; accordingly, only the optical system necessary for the description was shown. in FIG. 14.

As shown in FIG. 14, a light passing through an aperture of a plane 90 defining the shape of a light source was emitted to the grating stripes 92 as the second pattern through a first condenser 91. A light 93 passing through the grating stripes 92 as the second pattern was converged by a second condenser 94 and emitted to the reticle 3. The grating stripes 92 as the second pattern were disposed at a position conjugated to that of the reticle 3 by way of the second condenser lens 94, so that they could be scanned as the transmission type phase grating as in Example 1.

Grating stripes as the first pattern formed within a photosensitive film (not shown) provided on the wafer 8 are the same as those in Example 1. Thus, a fine pattern smaller than the conventional resolution limit was formed by scanning the grating stripes, without provision of the grating stripes as the second pattern in close proximity to the reticle 3.

In this example, the same effect can be obtained by a method wherein the grating stripes formed by the interference of two light beams of laser is used as the grating stripes 92 as the second pattern.

Figure 15A:
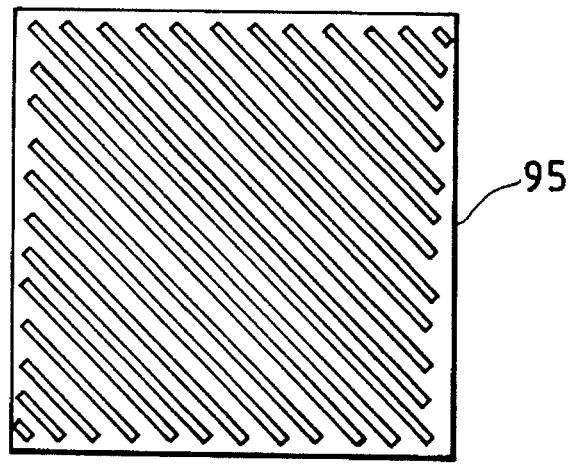
FIGS. 15(A) to 15(C) are views showing an example of plane shapes of grating stripes as the first or second pattern.
Figure 15B:
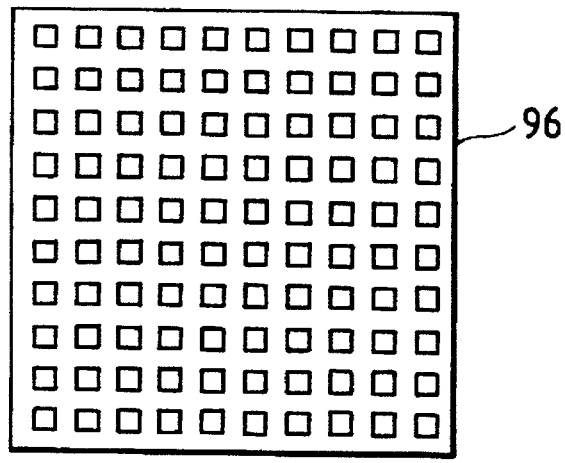
Figure 15C:
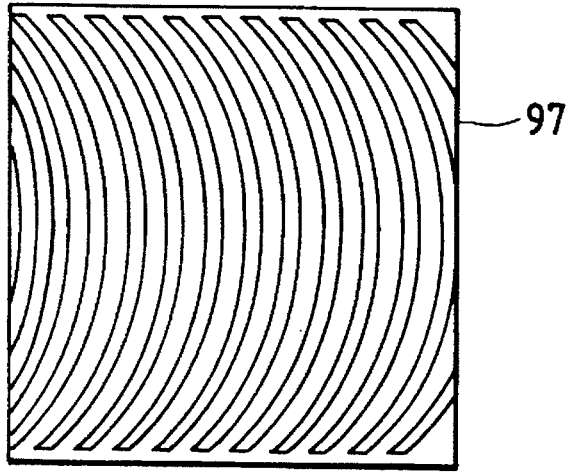

In each of Examples 1 to 5, one-dimensional pattern was projected; however, the present invention can be applied to the case where the projection of a two-dimensional pattern is made by provision of first and second grating stripes in the directions oblique from the X-axis and Y axis. The first and second grating stripes must be formed in parallel to each other; however, in this case, the error in obliquity is allowable to the degree of about 5°. As for the pitch of the grating stripes, the error is allowable to the degree of about 5%. The shapes of the first and second grating stripes are not limited to straight gratings, and the same effect can be obtained by the use of the grating stripes variously deformed, for example as shown in FIGS. 15b, 15c. As the above grating stripes, there may be adopted a phase grating obtained by provision of projections and recesses on a transparent substrate; grating stripes formed by a shadow pattern; or grating stripes formed by emission of laser light at least in two directions. A grating 96 shown in FIG. 15b was formed by the inference of a light emitted obliquely in four directions. A grating 97 shown in FIG. 15b was formed by the interference between a divergent light and a straight light.

In the above-described examples, a fine pattern of a semiconductor device was formed on a wafer substrate; however, the present invention is not limited thereto, and may be applied to various fields requiring fine patterns, such as fine optical elements, optical recording devices.

According to the present invention, it becomes possible to project a pattern smaller than the conventional resolution limit using an optical type projection exposure tool. Specifically, as compared with the conventional method, fine processing can be realized without requiring a special high quality projection lens, and therefore, the present invention is very useful for high integration of a semiconductor integrated device or the like.

In each example, a ultraviolet ray (i-line) was used as an exposure light; however, excimer laser or X-ray may be used. An optical system using an X-ray as an exposure light was shown in FIG. 16.

Figure 16:
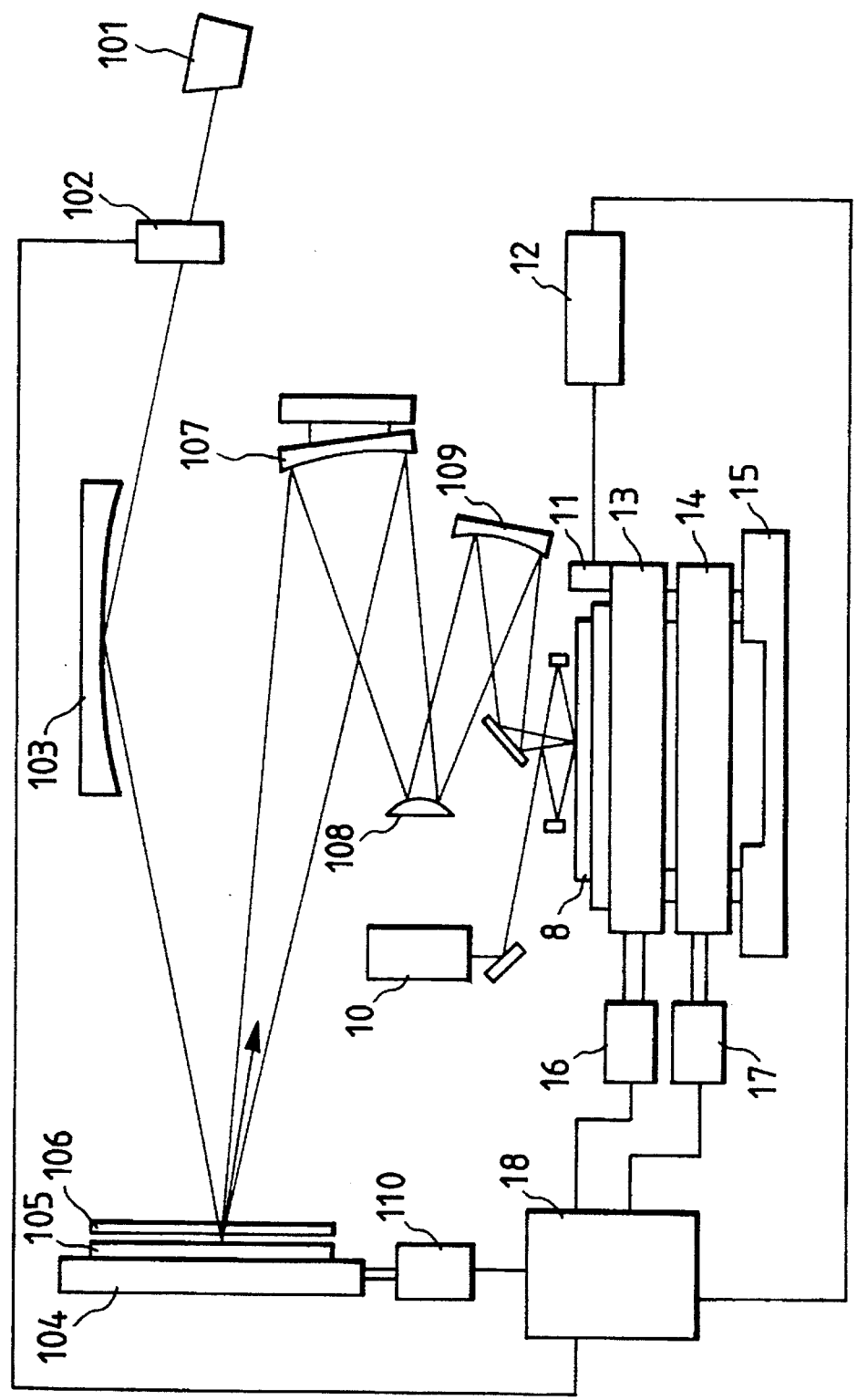
FIG. 16 is a view for illustrating a projection optical system in which an X-ray is used as an exposure light.

As illustrated in FIG. 16, the X-ray, emitted from the light source 101, passes through the shutter 102 and is reflected by the mirror 103 to illuminate the reticle 105, which is disposed on the mask stage 104 through the second grating pattern 106. The X-ray is diffracted by the reticle 105 and forms the image on the wafer 8 by the projection means including a plurality of mirrors 107, 108, 109.

The second grating pattern 106 is disposed near the reticle 105, and the laser source 10 is provided as illustrated in FIG. 16. Thus, the first grating pattern is formed in a photosensitive film, formed on the wafer 8, as described in Example 1.

In this instance, reticle 105 and the wafer 8 are synchronously moved by the mask pattern driving means 110 and x-y stage 14.

Other numerals in FIG. 16, recite same matters in other figures, respectively.

What is claimed is:

1. A pattern forming method comprising the steps of:

emitting an exposure light on a reticle having a mask pattern to be transferred for forming an image of said mask pattern;

modulating said image of said mask pattern; and demodulating said modulated image of said mask pattern by a first grating stripe pattern formed within a photosensitive film made of a material capable of reversibly inducing photochemical reaction, thereby forming said image corresponding to said mask pattern on a resist film formed under said photosensitive film.

2. A pattern forming method according to claim 1, wherein said modulation is performed by a second grating pattern disposed on a plane being close proximity to or conjugated to the plane of said mask pattern.

3. A pattern forming method according to claim 2, wherein respective spatial frequencies of said first and second grating stripe patterns are determined on the basis of the magnification of a projection exposure optical system of a projection exposure tool used.

4. A pattern forming method according to claim 1, wherein said first grating stripe pattern is formed in said photosensitive film by emitting a second light in said photosensitive film at least in two directions.

5. A pattern forming method according to claim 2, wherein said grating stripe pattern is an optical grating.

6. A pattern forming method according to claim 5, wherein said optical grating is disposed near said reticle in such a manner as to be superimposed on said reticle.

7. A pattern forming method according to claim 5, wherein said optical grating is a phase grating.

8. A pattern forming method according to claim 7, wherein said phase grating has a plurality of projections and recesses which are formed on a transparent substrate in such a manner as to be parallel to each other.

9. A pattern forming method according to claim 2, wherein spatial frequencies of said first and second grating stripe patterns are nearly equal to each other.

10. A pattern forming method according to claim 2, wherein said first and second grating stripe patterns are moved relative to said reticle in such a manner as to be synchronized with each other.

11. A pattern forming method according to claim 4, wherein the wavelength of said second light is shorter than that of said exposure light.

12. A pattern forming method according to claim 1, wherein said exposure light is emitted in said reticle in the direction oblique to the normal line of said reticle.

13. A pattern forming method according to claim 12, wherein a transparent substrate is disposed near said reticle in such a manner as to be superimposed on said reticle, and said photosensitive film is formed on said transparent substrate.

14. A pattern forming method according to claim 2, wherein the pitch of said first grating stripe pattern is equal to the product of the pitch of said second grating stripe pattern and the magnification of a projection lens of a projection exposure tool used.

15. A pattern forming method according to claim 1, wherein said exposure light is selected from a group consisting of a ultraviolet light, excimer laser and X-Ray.

16. A projection exposure tool according to claim 6, wherein said light beams are obliquely emitted onto said photosensitive film.

17. A pattern forming method according to claim 1, wherein a photoresist film is interposed between said substrate and said photosensitive film.

18. A projection exposure tool comprising:

a means for emitting an exposure light on a reticle having a specified mask pattern;

a means for supporting a substrate on which said mask pattern image is to be formed;

a means for projecting said mask pattern on said substrate;

a means for modulating an image of said mask pattern formed by emission of said exposure light from said means for emitting so as to produce modulated images of said mask pattern;

a means for emitting a second light;

a means for dividing said second light so as to form at least two light beams; and a means for demodulating said modulated images of said mask pattern by emitting said light beams at least in two directions onto a photosensitive film which is disposed on said substrate.

19. A projecting exposure tool according to claim 18, wherein said means for demodulating said modulated images of said mask pattern is a means for forming a first grating stripe pattern in said photosensitive film, and said means for modulating said image of said mask pattern is a means for forming a second grating stripe pattern near said reticle.

20. A projection exposure tool according to claim 19, wherein said means for forming said second grating stripe pattern is a means for forming a phase grating.

21. A projection exposure tool according to claim 19, further comprising a means for relatively moving said first and second grating stripe patterns within the planes of said substrate and said reticle, respectively.

22. A projection exposure tool according to claim 18, wherein said second light is a laser beam.

23. A projection exposure tool according to claim 19, wherein said means for forming said first grating stripe pattern is a means for emitting said light beams in said photosensitive film at least in two directions.

24. A projection exposure tool comprising:

a means for emitting an exposure light on a reticle having a specified mask pattern;

a means for projecting said mask pattern on a substrate on which said mask pattern image should be formed;

a means for modulating an image of said mask pattern formed by said emission of said exposure light; and a means for demodulating said modulated image of said mask pattern; wherein said means for demodulating said modulated image of said mask pattern is a means for forming a first grating stripe pattern on said substrate, and said means for modulating said image of said mask pattern is a means for forming a second grating stripe pattern near said reticle;

wherein said means for forming said first grating stripe pattern is a means for emitting a light on the surface of said substrate at least in two directions.

25. A projection exposure tool comprising:

a means for emitting an exposure light on a reticle having a specified mask pattern;

a means for projecting said mask pattern on a substrate on which said mask pattern image should be formed;

a means for modulating an image of said mask pattern formed by said emission of said exposure light; and a means for demodulating said modulated image of said mask pattern;

wherein said means for demodulating said modulated image of said mask pattern is a means for forming a first grating stripe pattern on said substrate, and said means for modulating said image of said mask pattern is a means for forming a second grating stripe pattern near said reticle;

wherein said means for forming said second grating stripe pattern is a means for emitting a light on the surface of said mask pattern of said reticle or a surface conjugated thereto at least in two directions.

* * * * *